(12) United States Patent
Inami et al.

(10) Patent No.: US 7,442,251 B2
(45) Date of Patent: *Oct. 28, 2008

(54) METHOD FOR PRODUCING SILICON SINGLE CRYSTALS AND SILICON SINGLE CRYSTAL PRODUCED THEREBY

(75) Inventors: Shuichi Inami, Tokyo (JP); Hiroki Murakami, Tokyo (JP); Nobumitsu Takase, Tokyo (JP); Ken Hamada, Tokyo (JP); Tsuyoshi Nakamura, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/406,272

(22) Filed: Apr. 19, 2006

(65) Prior Publication Data

US 2006/0283377 A1    Dec. 21, 2006

Related U.S. Application Data

(60) Provisional application No. 60/693,947, filed on Jun. 27, 2005.

(30) Foreign Application Priority Data

Jun. 20, 2005    (JP) .............................. 2005-179996

(51) Int. Cl.
 C30B 15/20    (2006.01)

(52) U.S. Cl. .............................. 117/13; 117/15; 117/17; 117/23; 117/932

(58) Field of Classification Search .................... 117/1, 117/13, 15, 17, 23, 932; 257/1; 438/1
See application file for complete search history.

(56) References Cited

U.S. PATENT DOCUMENTS

| | | | |
|---|---|---|---|
| 6,569,535 B2 * | 5/2003 | Murakami et al. ........... 428/446 |
| 6,663,708 B1 * | 12/2003 | Morita et al. .................. 117/3 |
| 6,702,892 B2 * | 3/2004 | Okui et al. .................... 117/214 |
| 6,730,580 B2 * | 5/2004 | Chen et al. .................... 438/474 |
| 6,843,847 B1 * | 1/2005 | Iida et al. ....................... 117/13 |
| 2002/0139298 A1 | 10/2002 | Okui et al. |
| 2006/0156969 A1 * | 7/2006 | Hourai et al. .................. 117/89 |
| 2006/0249074 A1 * | 11/2006 | Sugimura et al. ............. 117/84 |

FOREIGN PATENT DOCUMENTS

JP    03-115185    5/1991

(Continued)

OTHER PUBLICATIONS

U.S. Appl. No. 11/393,892, Ono et al., filed Mar. 31, 2006.*

(Continued)

*Primary Examiner*—Robert M Kunemund
(74) *Attorney, Agent, or Firm*—Pillsbury Winthrop Shaw Pittman, LLP

(57) ABSTRACT

This method for producing silicon single crystals includes: growing a silicon single crystal by the Czochralski method while cooling at least part of the silicon single crystal under growth with a cooling member which circumferentially surrounds the silicon single crystal and has an inner contour that is coaxial with a pull axis, wherein an ambient gas in which the silicon single crystal is grown includes a hydrogen-atom-containing substance in gaseous form. This silicon single crystal is produced by the above method.

13 Claims, 6 Drawing Sheets

FOREIGN PATENT DOCUMENTS

| | | |
|---|---|---|
| JP | 06-227888 | 8/1994 |
| JP | 11-189495 | 7/1999 |
| JP | 11-199385 | 7/1999 |
| JP | 2001-220289 | 8/2001 |
| KR | 2001-0090002 | 10/2001 |

OTHER PUBLICATIONS

U.S. Appl. No. 11/393,809, Ono et al., filed Mar. 31, 2006.*

Written Opinion of the International Search Authority for corresponding PCT International Patent Application No. PCT/JP2005/016783.

Taiwanese Office Action dated Mar. 17, 2008 for Appln. No. 094131687.

* cited by examiner

METHOD FOR PRODUCING SILICON SINGLE CRYSTALS AND SILICON SINGLE CRYSTAL PRODUCED THEREBY

This application claims priority from Japanese Patent Application No. 2005-179996, filed on Jun. 20, 2005 and U.S. Provisional Patent Application No. 60/693,947, filed on Jun. 27, 2005, the contents of which are incorporated herein by reference.

BACKGROUND OF THE INVENTION

1. Field of the Invention

The present invention relates to a method for producing silicon single crystals from which silicon wafers can be prepared. More particularly, the present invention relates to a method for producing silicon single crystals which inhibits the formation of dislocations caused by thermal stress and can grow dislocation-free portions in a high yield, and also relates to silicon single crystals produced thereby.

2. Background Art

The Czochralski (CZ) method is a commonly known technique for growing silicon single crystals to be used in preparing silicon wafers. One existing approach for efficiently producing silicon single crystals of the desired quality by the CZ method involves controlling the temperature of the silicon ingot during growth. For example, Patent Document 1 discloses a technique for rapidly cooling the solid-liquid interface or the vicinity thereof, on a silicon ingot being pulled, thereby increasing the maximum pull rate.

However, in the art disclosed in Patent Document 1, dislocations induced by a thermal stress readily arise due to cooling of the silicon ingot, resulting in a poor productivity and a low yield.

Generally, when dislocations have formed in a silicon single crystal during pulling, the already pulled ingot is melted and re-pulled in order to grow a silicon single crystal having a long dislocation-free portion.

However, in the case in which the pulling and melting of a silicon single crystal is repeated, because pulling takes a long time, the productivity decreases. Moreover, if the attempt to grow a dislocation-free crystal is ultimately abandoned and crystal growth is stopped, a large amount of silicon melt ends up remaining in the crucible. Not only is this a waste of the starting material, there is also a risk that volumetric expansion when the remaining silicon melt solidifies will damage the crucible and heater. For this reason, when dislocations have arisen numerous times in a silicon single crystal and the pulled ingot has been melted and re-pulled, if there remains little hope that a silicon ingot having a long dislocation-free portion can be pulled, the practice until now has been to go ahead and pull the ingot regardless of the presence of dislocations.

Furthermore, because a silicon single crystal in which such dislocations have arisen many times will have large crystal grain slippage due to thermal stresses during growth, after the pulled silicon single crystal has been cooled to room temperature, large residual stresses will arise due to such crystal grain slippage. As a result, the slightest impact when a pulled silicon ingot is removed from the furnace or when a silicon ingot that has been removed from the furnace is transported can easily create stresses that exceed the yield stress of the silicon, causing the crystal to crack.

(Patent Document 1) Japanese Patent Application, First Publication No. H11-199385

SUMMARY OF THE INVENTION

It is therefore an object of the present invention to provide a method for producing silicon single crystals which can inhibit the formation of dislocations caused by thermal stresses that arise from cooling the lateral surface of the silicon single crystal during growth and is thus capable of growing, in a good yield and with excellent productivity, a silicon single crystal that resists cracking and has a long dislocation-free portion.

Accordingly, the present invention provides a method for producing silicon single crystals, the process comprising: growing a silicon single crystal by the Czochralski method while cooling at least part of the silicon single crystal under growth with a cooling member which circumferentially surrounds the silicon single crystal and has an inner contour that is coaxial with a pull axis, wherein an ambient gas in which the silicon single crystal is grown includes a hydrogen-atom-containing substance in gaseous form. In the practice of the present invention, "at least part of the silicon single crystal under growth" may refer to any portion of the silicon single crystal, such as the body, neck or tail. For example, it may be the lateral surface portion of the silicon single crystal passing through a hot zone.

In the above method for producing silicon single crystals, the gaseous hydrogen-atom-containing substance in the ambient gas may have a molecular hydrogen partial pressure of 40 to 400 Pa.

In the above method for producing silicon single crystals, the gaseous hydrogen-atom-containing substance may be hydrogen gas.

In the above method for producing silicon single crystals, a lateral surface portion of the silicon single crystal under growth may be cooled in such a way that the ratio Gc/Ge between an axial temperature gradient at a center portion of the crystal, Gc from the silicon melting point to 1350° C. and an axial temperature gradient at an outer circumferential portion, Ge of the crystal from the silicon melting point to 1350° C. is from 1.1 to 1.4.

In the above method for producing silicon single crystals, the axial temperature gradient at the center portion of the crystal, Gc may be set to from 3.0 to 3.5° C./mm using the cooling member.

The above method for producing silicon single crystals may render a body portion of the silicon single crystal into a defect-free region that is free of grown-in defects.

The silicon single crystal of the present invention is produced by any of the foregoing aspects of the method for producing silicon single crystals.

The quality (defect state) and productivity (pull rate) of a silicon single crystal produced by the CZ method are explained.

Microdefects that appear in the course of device fabrication, i.e., grown-in defects, are known to form in silicon single crystals produced by the CZ method. FIG. 1 is a transverse sectional view showing the defect distribution state in the radial direction of a silicon ingot obtained by the CZ method. As shown in FIG. 1, the grown-in defects in a silicon single crystal obtained by the CZ method include vacancies about 0.1 to 0.2 μm in size which are known as IR scattering defects or crystal originated particles (COPs), and small dislocations about 10 μm in size which are called dislocation clusters.

In the silicon single crystal shown in FIG. 1, oxygen-induced stacking faults (OSF) form a ring-like region located radially at about two-thirds of the diameter of the crystal. Inside the OSF-forming region, there is an "IR scattering defect-forming region" where infrared scattering defects are detected at a density of $10^5$ to $10^6/cm^3$. Outside the OSF-forming region lies a "dislocation cluster-forming region" having dislocation clusters in a density of about $10^3$ to $10^4/cm^3$.

FIG. 2 shows the defect distribution state in a longitudinal sectional view of a silicon single crystal grown at a pull rate that was gradually reduced during pulling. Here, the transverse section shown in FIG. 1 is of a silicon single crystal grown at a pull rate corresponding to position A in FIG. 2.

As shown in FIG. 2, at a rapid pull rate, a ring-like OSF-forming region appears at the outer circumferential portion of the crystal, and the portion of the crystal inside the OSF-forming region is an IR scattering defect-forming region where numerous IR scattering defects arise. As the pull rate decreases, the diameter of the OSF-forming region gradually decreases and a dislocation cluster-forming region where dislocation clusters arise appears in the portion of the crystal lying outside of the OSF-forming region. Eventually, the OSF-forming region vanishes and the dislocation cluster-forming region extends over the entire cross-section of the crystal.

Outside of and adjacent to the ring-like OSF-forming region, there is an oxygen precipitation-promoting region (PV region) where oxygen precipitates (bulk microdefects, BMD) are allowed to form. An oxygen precipitation-inhibiting region (PI region) where oxygen precipitation does not occur lies between the oxygen precipitation-promoting region and the dislocation cluster-forming region. The oxygen precipitation-promoting region (PV region), oxygen precipitation-inhibiting region (PI region) and ring-like OSF-forming region are all defect-free regions having very few grown-in defects.

Compared with silicon single crystals in which dislocation clusters are detected, silicon single crystals in which IR scattering defects are detected have less of an adverse influence on devices and can be pulled at a higher rate, allowing for better productivity.

With the recent trend in integrated circuits toward smaller geometries, there has been some concern over a decline in gate oxide integrity due to IR scattering defects. Accordingly, there exists a need for high-quality silicon single crystals having a defect-free region where neither IR scattering defects nor dislocation clusters can be detected.

Silicon single crystals of the desired defect state can be obtained by controlling the ratio V/G between the pull rate V (mm/min.) and the temperature gradient G (° C./mm) on the crystal side at or in the vicinity of the solid-liquid interface.

An example of silicon single crystal growth is explained while referring to FIGS. 1 and 2. In the example, a silicon single crystal was grown using a hot zone structure that does not carry out temperature regulation to control the temperature gradient G at the lateral surface portion of the silicon single crystal. In this hot zone structure, the temperature gradient at the center of the crystal (Gc) is smaller than the temperature gradient at the outer circumferential portion of the crystal (Ge); that is, Gc<Ge. Also, the length of time during which the silicon single crystal under growth has a temperature in a range of 1000 to 800° C., i.e., the time it takes for the crystal under growth to pass through a temperature range of 1000 to 800° C., exceeds 180 minutes. During the period of time when the silicon single crystal under growth has a temperature in a range of 1000 to 800° C., the crystal lies in a temperature region where OSF nuclei grow within the crystal.

Methods for growing silicon single crystals having a desired defect state by controlling the temperature gradient G on the crystal side at or in the vicinity of the solid-liquid interface are described here using examples.

For instance, let us consider a method for growing a silicon single crystal from which a wafer having a uniform defect-free region over the entire surface can be obtained, using a hot zone structure by which the temperature gradient at the center of the crystal (Gc) is controlled to be equal to or greater than the temperature gradient at the outer circumferential portion of the crystal (Ge); that is, Gc≧Ge.

Specifically, the hot zone structure is improved by modifying the dimensions and position of the heat shield which circumferentially surrounds the single crystal immediately after solidification and by using a cooling unit to effect cooling. In this way, the lateral surface portion of the silicon single crystal under growth is cooled and the temperature gradient G on the crystal side at or in the vicinity of the solid-liquid interface is controlled so that Gc≧Ge in a temperature range from the melting point to around 1250° C. FIG. 3 is a diagram illustrating the defect distribution state in a longitudinal section of a silicon single crystal grown while gradually lowering the pull rate during pulling using a crystal growing apparatus having a hot zone structure by which the temperature gradient at the center of the crystal, Gc is controlled to be equal to or larger than the temperature gradient at the outer circumferential portion of the crystal, Ge (i.e., Gc≧Ge).

When growing the crystal at a pull rate in the range of B to C shown in FIG. 3 using a crystal growing apparatus having a hot zone structure by which a relation of Gc≧Ge is realized, it is apparent from this diagram of FIG. 3 that the temperature gradient G on the crystal side at or in the vicinity of the solid-liquid interface is controlled and that there can be obtained a silicon single crystal composed of a defect-free region. Moreover, in the crystal growth example illustrated in FIG. 3, the pull rate at which it is possible to pull a defect-free crystal can be made relatively rapid compared with the example shown in FIG. 2. Here, the pull rate range in which a defect-free crystal can be pulled (the range from B to C in FIG. 3) is referred to as the "pull rate margin for defect-free crystals".

In the example of silicon single crystal growth shown in FIG. 3, the length of time during which the silicon single crystal under growth has a temperature in a range of 1000 to 800° C., i.e., the time it takes for the silicon single crystal under growth to pass through a temperature range of 1000 to 800° C., is 80 to 180 minutes. Therefore, in this example of silicon single crystal growth shown in FIG. 3, the length of time during which the temperature of the silicon single crystal during growth is in a range of 1000 to 800° C. is shorter than in the example shown in FIG. 2. As a result, the growth of OSF nuclei in the silicon single crystal is inhibited, enabling the pull rate margin for defect-free crystals to be increased.

However, in the example of silicon single crystal growth illustrated in FIG. 3, the temperature gradient G at the crystal side at or in the vicinity of the solid-liquid interface is controlled by cooling the lateral surface portion of the silicon single crystal under growth. Thus, compared with the example in FIG. 2 in which temperature regulation for controlling the temperature gradient G is not carried out at the lateral surface portion of the silicon single crystal, the lateral surface portion of the silicon single crystal under growth incurs a larger thermal stress, facilitating the formation of thermal stress-induced dislocations.

The method for producing silicon single crystals of the present invention can also be advantageously employed by using a crystal growing apparatus having a hot zone structure that cools the lateral surface portion of the silicon single crystal under growth. In the method for producing silicon single crystals of the present invention, the silicon single crystal is grown in an ambient gas that includes a hydrogen-atom-containing substance in gaseous form, such as a mixed gas composed of an inert gas and the gaseous hydrogen-atom-containing substance. Hence, even under conditions where thermal stresses are incurred at the lateral surface portion of the silicon ingot under growth, such as in the case in which the lateral surface portion of the silicon ingot under growth is cooled to control the temperature gradient G on the crystal side at or in the vicinity of the solid-liquid interface, the formation of thermal stress-induced dislocations can be suppressed in the manner described below.

One type of thermal stress-induced dislocation is a slip dislocation that originates at a dislocation cluster that arises when thermal stresses cannot be resisted. In the present invention, because the elemental hydrogen in the gaseous hydrogen-atom-containing substance finds its way into interstitial sites within the silicon crystal, this has the same effect as increasing the concentration of interstitial atoms in the silicon, and thus makes it possible to reduce the number of interstitial atoms incorporated into the crystal from the silicon melt in the course of silicon solidification.

Hence, in the present invention, the formation of dislocation clusters due to interstitial atoms can be inhibited by hydrogen, thus discouraging the formation of slip dislocations that originate at dislocation clusters and inhibiting the formation of dislocations. As a result, compared with cases in which hydrogen is not added to the gas ambient, the method of the present invention enables the growth of high-quality silicon single crystals that undergo dislocation formation less frequently, are less likely to crack, and have longer dislocation-free portions.

In the example shown in FIG. 2 in which temperature regulation for controlling the temperature gradient G at the lateral surface portion of the silicon single crystal is not carried out, the thermal stress incurred at the lateral surface portion of the silicon single crystal during growth is generally about 28 MPa, which is less than 30 MPa. By contrast, in the example shown in FIG. 3, where use is made of a crystal growing apparatus having a hot zone structure by which the relation of Gc≧Ge is realized, the lateral surface portion of the crystal under growth incurs a thermal stress of generally about 30 to 45 MPa, which is 30 MPa or more. The formation of thermal stress-induced dislocations becomes notable at a thermal stress of 30 MPa or more, and the formation of dislocations and cracking occur very readily at a thermal stress of 40 MPa or more.

The method of the present invention is able to effectively inhibit the formation of the thermal stress-induced dislocations even under conditions in which the lateral surface portion of the silicon single crystal under growth incurs a thermal stress of 30 MPa or more, at which the formation of thermal stress-induced dislocations becomes notable.

Moreover, the formation of thermal stress-induced dislocations can be effectively inhibited even under conditions where the lateral surface portion of the silicon single crystal under growth is subjected to a thermal stress of 40 MPa or more at which, in the prior art, a silicon single crystal that has been grown and cooled after undergoing dislocation formation numerous times would have developed residual stresses close to the yield stress of the silicon.

In the method for producing silicon single crystals of the present invention, hydrogen gas can be used as the hydrogen-atom-containing substance in gaseous form. However, use can also be made of any one or more gas selected from among hydrogen-atom-containing inorganic compounds such as $H_2O$ and HCl, silane gases, hydrocarbons such as $CH_4$ and $C_2H_2$, and various other hydrogen-atom-containing substances in gaseous form, including alcohols, and carboxylic acids.

When hydrogen gas is used as the gaseous hydrogen-atom-containing substance, it can be fed into the crystal pulling furnace through a specialized line from a commercial hydrogen gas cylinder, a hydrogen gas storage tank, or a hydrogen tank that stores hydrogen in a hydrogen storage alloy.

One or more gas selected from among argon, helium, neon, krypton and xenon can be used as the inert gas (rare gas). Argon gas, which is inexpensive, is generally used; however, one or more of other inert gas such as helium, neon, krypton or xenon may be mixed and used together with argon gas.

Letting the molecular hydrogen-equivalent concentration of the gaseous hydrogen-atom-containing substance be $\alpha$ and the oxygen gas ($O_2$) concentration be $\beta$, the concentration of oxygen gas ($O_2$) in the ambient gas is made to satisfy the relationship $\alpha - 2\beta \leqq 3$ vol %. If the concentration $\beta$ of oxygen gas ($O_2$) in the ambient gas and the molecular hydrogen-equivalent concentration $\alpha$ of the gaseous hydrogen-atom-containing substance fail to satisfy the above relationship, the hydrogen atoms incorporated into the silicon single crystal will fail to provide an effect of inhibiting formation of grown-in defects.

FIG. 4 is a diagram which shows the defect distribution state in a longitudinal section of a silicon ingot obtained using the method for producing silicon single crystals of the present invention. The silicon single crystal shown in FIG. 4 was grown using, as in the example shown in FIG. 3, a crystal growing apparatus having a hot zone structure by which the relation of Gc≧Ge is realized. An inert gas to which hydrogen had been added to a hydrogen partial pressure of 250 Pa was supplied to the crystal pulling furnace, and the crystal was grown while gradually lowering the pull rate during pulling.

In the case in which a mixed gas composed of an inert gas and hydrogen is used as the gas ambient in which the single crystal is grown, as explained above, the hydrogen inhibits the formation of dislocation clusters originating from interstitial atoms; thereby, the defect-free region moves toward the low pull rate side. Therefore, compared with the example shown in FIG. 3 in which the gas ambient was an inert gas, as shown in FIG. 4, the minimum pull rate at which a defect-free crystal can be pulled is lower, increasing the pull rate range in which it is possible to pull a defect-free crystal; i.e., the pull rate margin for defect-free crystals (in FIG. 4, the range from D to E).

Most of the hydrogen which has exerted an influence on the formation of grown-in defects escapes from the crystal in the course of subsequent cooling.

In the case in which a mixed gas composed of an inert gas and hydrogen was used as the ambient gas, hydrogen dissolves into the silicon melt at a concentration proportional to the partial pressure of the hydrogen present within the inert gas atmosphere, and becomes distributed throughout the silicon crystal that solidifies.

According to Henry's law, the hydrogen concentration in the silicon melt is dependent on the hydrogen partial pressure in the gas phase and is expressed as:

$$P_{H2} = kC_{LH2}.$$

Here, $P_{H2}$ is the hydrogen partial pressure of the ambient, $C_{LH2}$ is the hydrogen concentration in the silicon melt, and k is a coefficient between the two.

The hydrogen concentration in the silicon single crystal, which is determined by the relationship between the hydrogen concentration in the silicon melt and segregation, is expressed as:

$$C_{SH2} = k'C_{LH2} = (k'/k)P_{H2}.$$

Here, $C_{SH2}$ is the hydrogen concentration in the crystal, and k' is the segregation coefficient between the silicon melt and the silicon crystal for hydrogen.

From the above, in the case in which the crystal is grown in a hydrogen-containing inert gas ambient, the hydrogen concentration in the silicon single crystal just after solidification can be controlled to a constant desired concentration in the axial direction of the crystal by controlling the hydrogen partial pressure in the ambient. This hydrogen partial pressure can in turn be controlled by means of the hydrogen concentration and the pressure within the furnace.

FIG. 5 is a graph showing the relationship between the hydrogen partial pressure in the ambient and the ratio V/G. So long as the hot zone structure is the same, the temperature distribution in the interior of the single crystal during pulling remains substantially the same even if the pull rate changes. Hence, V/G in FIG. 5 can be regarded as the pull rate. As shown in FIG. 5, as the hydrogen partial pressure of the ambient rises, the pull rate at which a defect-free crystal can be obtained decreases, but the pull rate margin for defect-free crystals becomes larger.

The pull rate margin for the OSF region narrows as the hydrogen partial pressure increases. The pull rate margin for the PI region broadens substantially as the hydrogen partial pressure increases. The pull rate margin for the PV region both widens and narrows as the hydrogen partial pressure increases, but is larger at a hydrogen partial pressure of 100 to 250 Pa.

In the method for producing silicon single crystals of the present invention, by setting the molecular hydrogen partial pressure of the hydrogen-atom-containing substance in the gas ambient within a range of 40 to 400 Pa, the formation of thermal stress-induced dislocations can be effectively inhibited. At a molecular hydrogen partial pressure of less than 40 Pa, a sufficient effect to inhibit formation of dislocations may not be achievable. On the other hand, at a molecular hydrogen partial pressure of more than 400 Pa, macrovoid defects known as hydrogen defects have a tendency to arise. By setting the molecular hydrogen partial pressure of the gaseous hydrogen-atom-containing substance in the gas ambient to 400 Pa or less, even should air leak into the silicon crystal growing apparatus, combustion does not occur, enabling the equipment to be safely operated.

Also, as shown in FIG. 5, by setting the molecular hydrogen partial pressure of the gaseous hydrogen-atom-containing substance in the gas ambient within a range of 40 to 400 Pa, the pull rate margin for obtaining a defect-free crystal can be made larger. It is thus possible to easily grow a silicon ingot from which can be obtained large-diameter silicon wafers whose entire surface is defect-free crystal. Moreover, it is easier to selectively grow silicon single crystals from which can be obtained silicon wafers whose entire surface is a PV region and silicon single crystals whose entire surface is a PI region. When the molecular hydrogen partial pressure is set to less than 40 Pa, a sufficient effect to increase the pull rate margin for obtaining a defect-free crystal cannot be achieved.

In addition, as shown in FIG. 5, by setting the molecular hydrogen partial pressure of the gaseous hydrogen-atom-containing substance in the gas ambient within a range of 40 to 160 Pa (range I in FIG. 5), there can easily be grown a silicon single crystal from which can be obtained silicon wafers whose entire surface is a PV region. At a molecular hydrogen partial pressure of more than 160 Pa, PI regions tend to be included, making it difficult to grow silicon single crystals from which can be obtained silicon wafers whose entire surface is a PV region. Because oxygen precipitates readily form in PV regions, by subjecting the surface of a silicon wafer composed of PV regions to a so-called denuded zone (DZ) layer-forming treatment, BMDs that have a gettering action can easily be formed in the interior.

Referring again to FIG. 5, by setting the molecular hydrogen partial pressure of the gaseous hydrogen-atom-containing substance in the gas ambient within a range of 160 to 400 Pa (range II in FIG. 5), a silicon single crystal from which can be obtained silicon wafers whose entire surface is a PI region can easily be grown. Moreover, the OSF-forming region can be shrunk, enabling wafers composed of defect-free crystal having an increased oxygen concentration to be easily prepared. At a molecular hydrogen partial pressure of less than 160 Pa, PV regions tend to be included, making it difficult to grow silicon single crystals from which can be obtained silicon wafers whose entire surface is a PI region.

FIG. 7 is a diagram illustrating the defect distribution state in the longitudinal section of another silicon single crystal obtained using the method for producing silicon single crystals of the present invention. By modifying the dimensions and position of a heat shield which circumferentially surrounds the single crystal just after solidification and by using a cooling unit to forcibly cool the silicon single crystal during growth, the crystal growing apparatus is provided with a hot zone structure by which the ratio Gc/Ge is made to be from 1.1 to 1.4 and the axial temperature gradient is made to be from 3.0 to 3.5° C./mm. By using this crystal growing apparatus, cooling the lateral surface portion of the silicon single crystal under growth so as to control the temperature gradient G on the crystal side at or in the vicinity of the solid-liquid interface, and feeding into the crystal pulling furnace an inert gas to which hydrogen has been added at a hydrogen partial pressure of 240 Pa, a silicon single crystal is grown while gradually lowering the pull rate during pulling. The silicon single crystal shown in FIG. 7 was grown in this way.

FIG. 6 is a diagram illustrating the defect distribution state in a longitudinal section of a silicon single crystal grown by using a crystal growing apparatus having the same hot zone structure as in the case of FIG. 7, regulating the temperature at the lateral surface portion of the silicon single crystal under growth so as to control the temperature gradient G on the crystal side at or in the vicinity of the solid-liquid interface, feeding only inert gas to the crystal pulling furnace, and gradually lowering the pull rate during pulling.

Even when a crystal growing apparatus having such a hot zone structure is used, the lateral surface portion of the silicon single crystal during growth generally incurs a thermal stress of about 30 to 45 MPa and the length of time during which the silicon single crystal under growth has a temperature within a range of 1000 to 800° C., i.e., the time it takes for the silicon single crystal during growth to pass through a temperature range of 1000 to 800° C., is from 80 to 180 minutes.

In the method for producing silicon single crystals of the present invention, the gas ambient in which the single crystal is grown is a mixed gas composed of an inert gas and a gaseous hydrogen-atom-containing substance. Therefore, even when use is made of a crystal growing apparatus having a hot zone structure by which the ratio Gc/Ge between the axial temperature gradient at the center portion of the crystal, Gc from the melting point to 1350° C. and the axial temperature gradient at the outer circumferential portion of the crystal, Ge from the melting point to 1350° C. is made to be from 1.1 to 1.4 and the axial temperature gradient Gc is made to be from 3.0 to 3.5° C./mm, the formation of thermal stress-induced dislocations can be effectively inhibited.

As shown in FIG. 7, compared with the example shown in FIG. 6 in which the gas ambient is an inert gas, the pull rate margin for obtaining a defect-free crystal (in FIG. 6, the range from F to G; in FIG. 7, the range from F to G) can be enlarged by using the above-described method for growing the crystal. Also, by using a crystal growing apparatus having a hot zone structure by which Gc/Ge is made to be from 1.1 to 1.4 and furnace is in a range of 4 to 6.7 kPa (30 to 50 torr), nitrogen ($N_2$) may be present within the gas ambient at a concentration of 20 vol % or less.

In the case in which the nitrogen concentration exceeds 20 vol %, dislocations may arise in the silicon single crystal.

The method for producing silicon single crystals of the present invention makes it possible to inhibit the formation of thermal stress-induced dislocations due to cooling at the lateral surface portion of the silicon single crystal under growth. As a result, silicon single crystals that do not crack easily and have a long defect-free region can be grown in a high yield, enabling an excellent productivity to be achieved.

Figure 6:
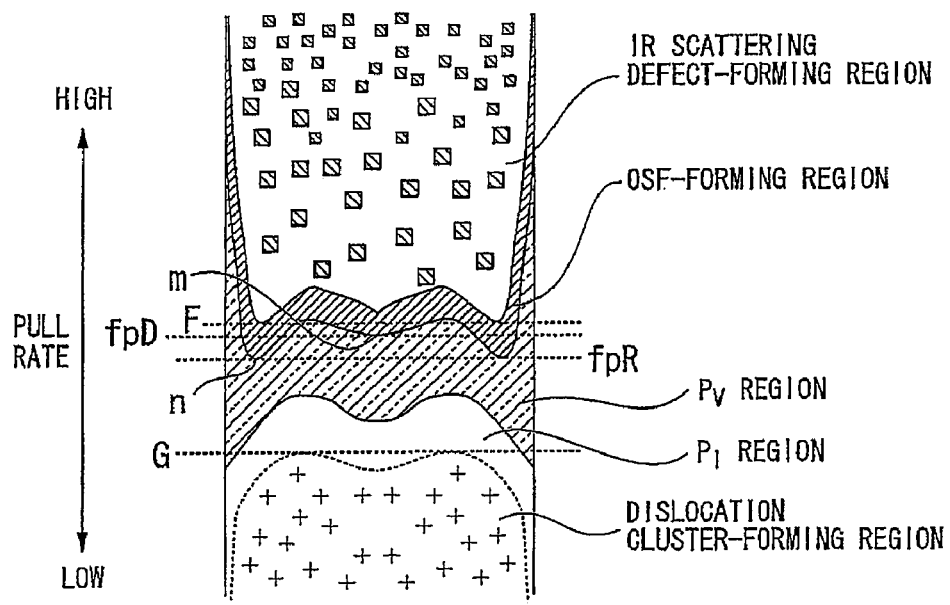
Figure 7:
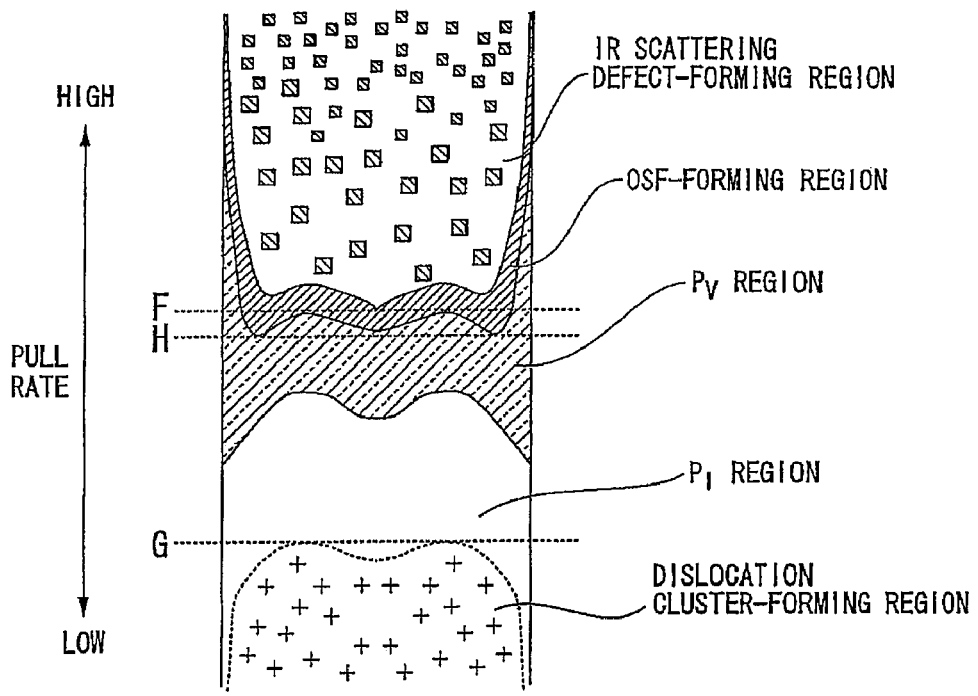

Also, as shown in FIGS. 6 and 7, by using a crystal growing apparatus having a hot zone structure by which Gc/Ge is made to be from 1.1 to 1.4 and the axial temperature gradient Gc is made to be from 3.0 to 3.5° C./mm, control so as to satisfy the following relationship is possible.

$$-20 \leq [(fpD - fpR)/fpD] \times 100 \leq +20 \ (\%)$$

In the formula, referring to FIG. 6, fpD is the pull rate, at the boundary surface that is formed between the PV region and the OSF-forming region, which corresponds to the growth of a region m where the center is convex in the direction of the crystal axis. Also, fpR is the pull rate which corresponds to the growth of a region n that is convex in a ring-like shape (the region which is convex in the direction of the crystal axis at an intermediate position between the center of the crystal and the outermost area in the radial direction of the crystal).

In the practice of the present invention, in the case in which the pressure in the portion of the crystal, Ge (Gc≧Ge), and while gradually lowering the pull rate during crystal pulling.

Figure 1:
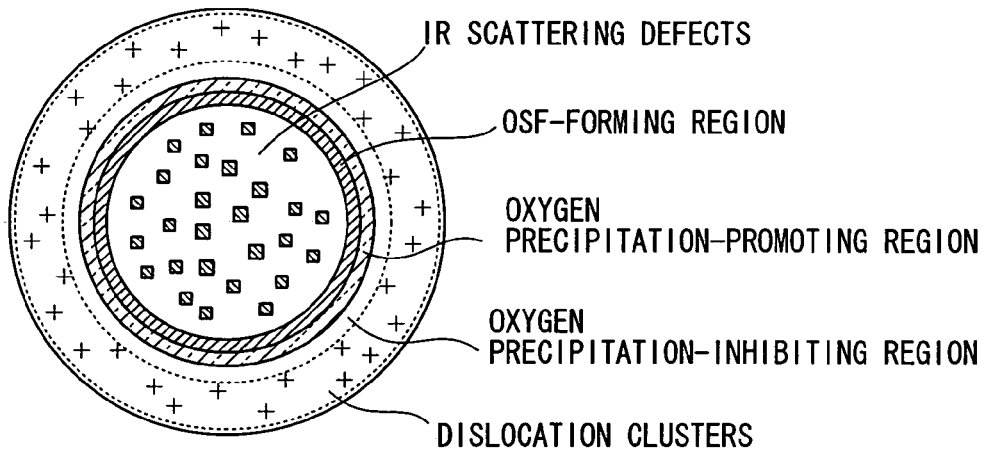
FIG. 1 is a transverse sectional view illustrating the defect distribution state in the radial direction of a silicon single crystal obtained by the CZ method.
Figure 2:
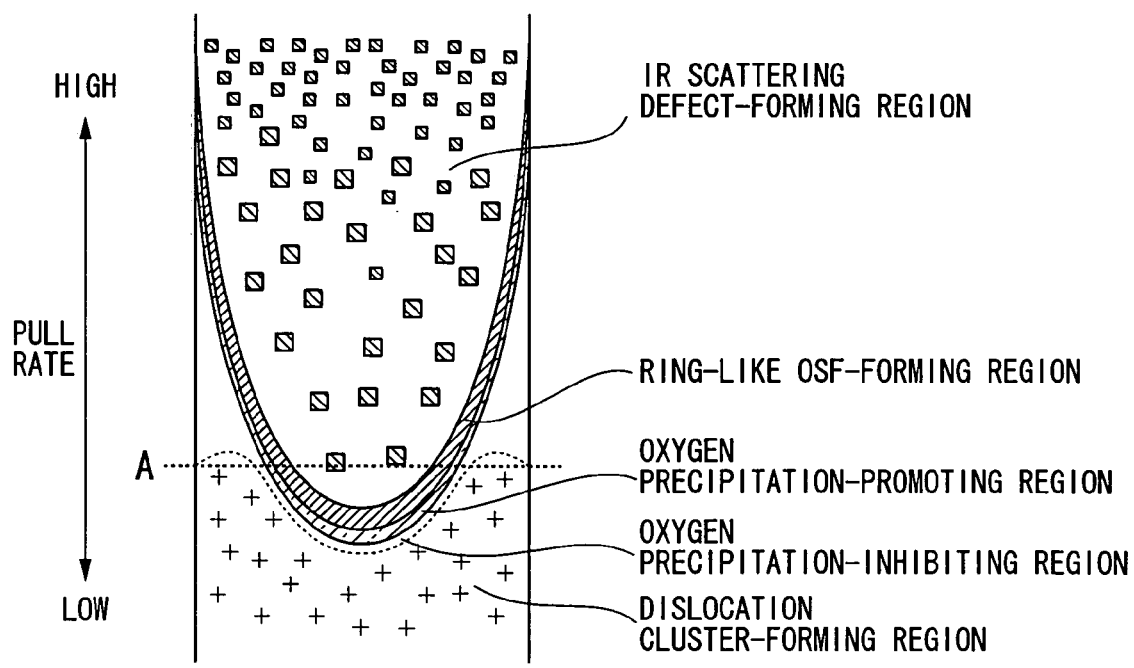
FIG. 2 is a diagram illustrating the defect distribution state in a longitudinal section of a silicon single crystal which has been grown without temperature regulation to control the temperature gradient G at the lateral surface portion of the silicon single crystal, that is, using a crystal growing apparatus having a hot zone structure by which the temperature gradient at the center of the crystal, Gc is made to be smaller than the temperature gradient at the outer circumferential portion of the crystal, Ge (Gc<Ge), and while gradually lowering the pull rate during crystal pulling.
Figure 3:
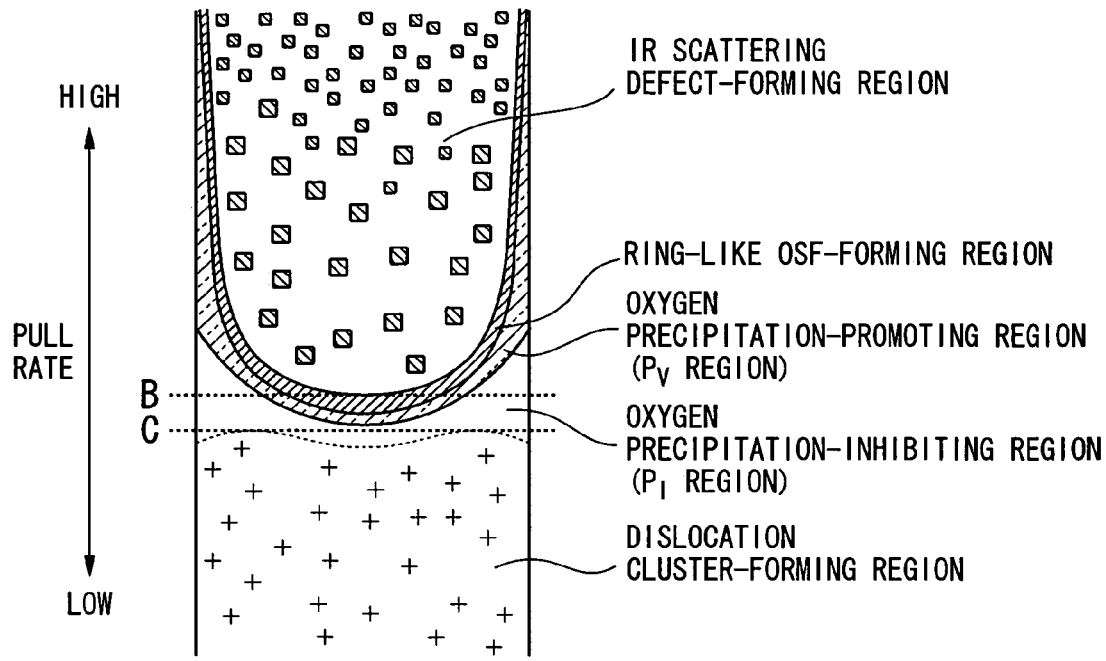
FIG. 3 is a diagram illustrating the defect distribution state in a longitudinal section of a silicon single crystal which has been grown while cooling the lateral surface portion of the silicon single crystal during growth, that is, using a crystal growing apparatus having a hot zone structure by which the temperature gradient at the center of the crystal, Gc is made to be the same as or larger than the temperature gradient at the outer circumferential the axial temperature gradient Gc is made to be from 3.0 to 3.5° C./mm, the temperature gradient G on the crystal side at or in the vicinity of the solid-liquid interface becomes larger. Hence, the pull rate V can be increased without changing the V/G ratio, enabling the minimum pull rate at which a defect-free crystal can be pulled to be improved. Moreover, by using the above-described method for growing crystals, the V/G controllability during the pulling of a silicon single crystal can be enhanced. In addition, as shown in FIG. 7, by using the above method for growing crystals, the pull rate margin for the oxygen precipitation-promoting region (PV region) and the pull rate margin for the oxygen precipitation-inhibiting region (PI region); that is, the range from H to G in FIG. 7, can be increased. Hence, there can be obtained silicon single crystals from which can be prepared wafers whose entire surface is a PV region and silicon single crystals from which can be prepared wafers whose entire surface is a PI region.
Figure 4:
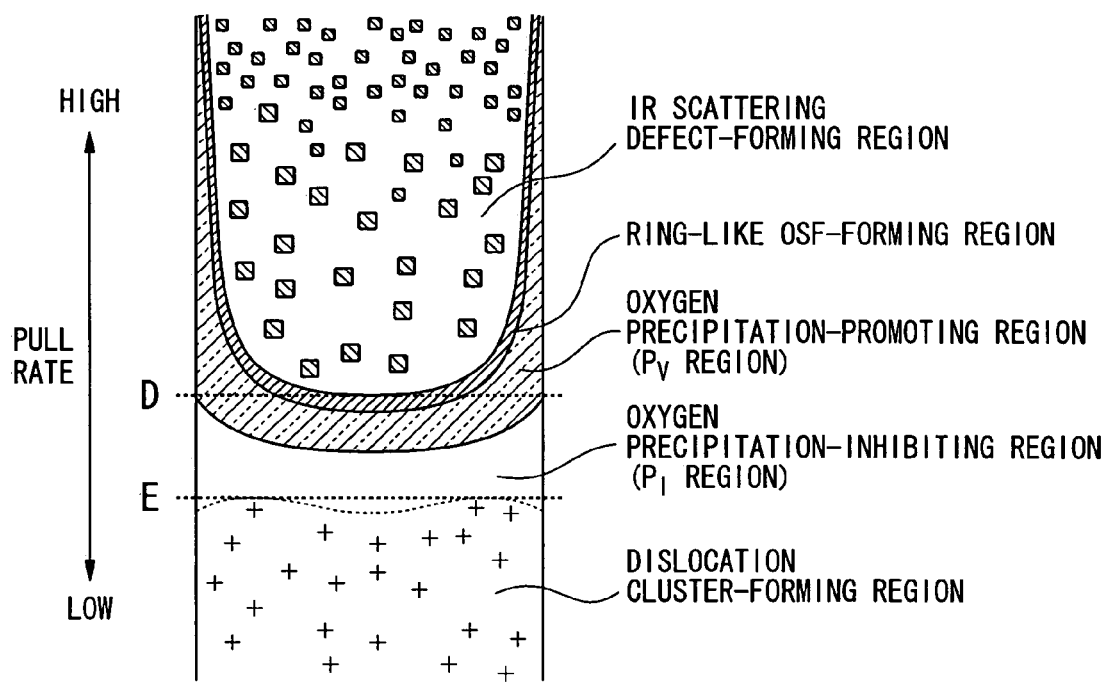

FIG. 4 is a diagram illustrating the defect distribution state in a longitudinal section of a silicon single crystal obtained using the method for producing silicon single crystals of the present invention.

Figure 5:
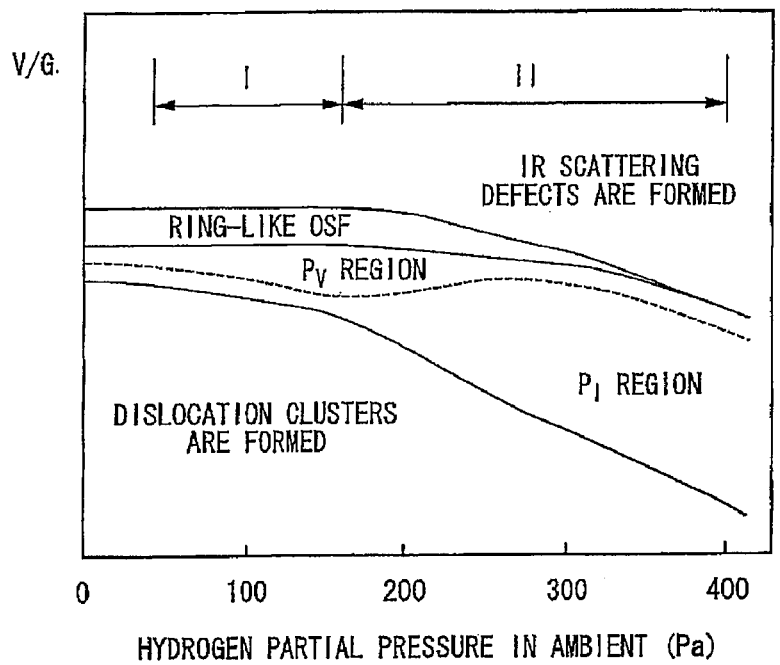

FIG. 5 is a graph showing the relationship between the hydrogen partial pressure in the gas ambient and the ratio V/G.

FIG. 6 is a diagram illustrating the defect distribution state in a longitudinal section of a silicon single crystal which has been grown using a crystal growing apparatus having a hot zone structure by which the ratio Gc/Ge is made to be from 1.1 to 1.4 and the axial temperature gradient Gc is made to be from 3.0 to 3.5° C./mm, and while gradually lowering the pull rate during crystal pulling.

FIG. 7 is a diagram illustrating the defect distribution state in a longitudinal section of a silicon single crystal which has been grown by using a crystal growing apparatus having a hot zone structure by which the ratio Gc/Ge is made to be from 1.1 to 1.4 and the axial temperature gradient Gc is made to be from 3.0 to 3.5° C./mm and feeding the crystal pulling furnace with an inert gas to which hydrogen has been added, and while gradually lowering the pull rate during crystal pulling.

Figure 8:
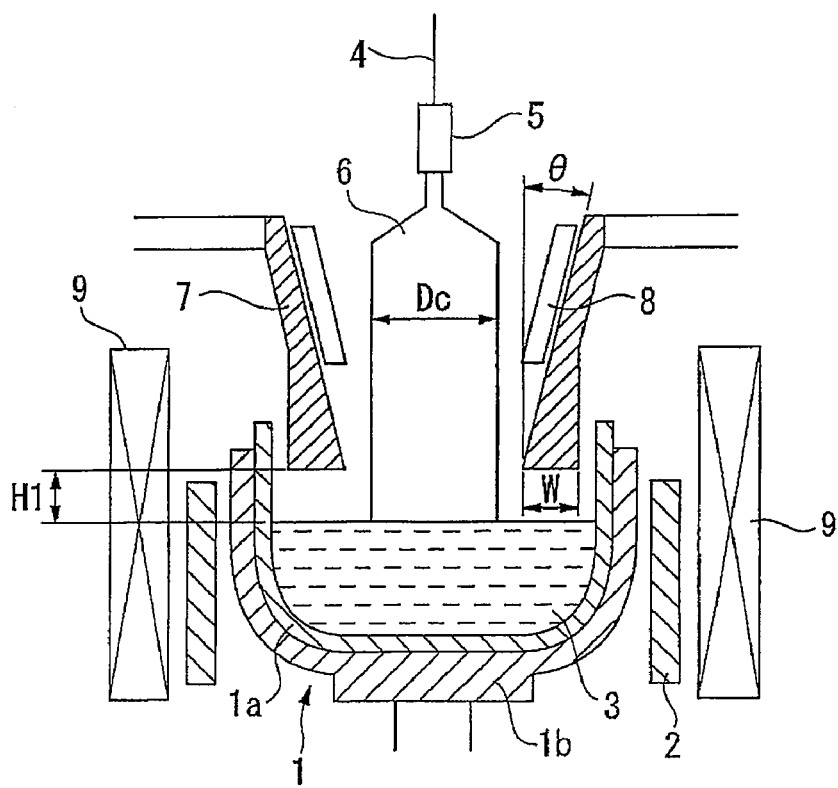

FIG. 8 is a vertical sectional view of a CZ furnace suitable for carrying out the method for producing silicon single crystals of the present invention.

Figure 9:
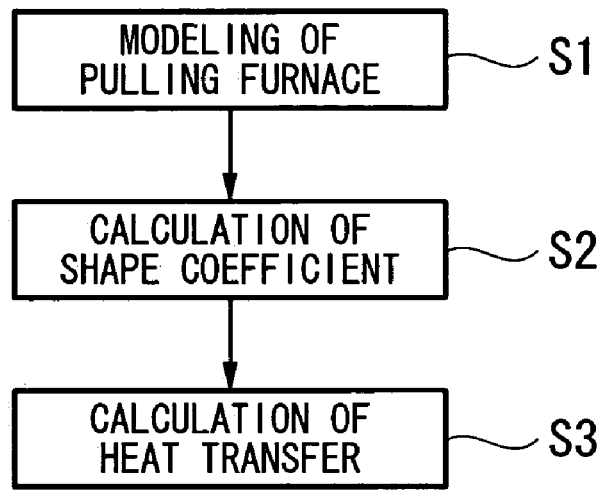

FIG. 9 is a flow chart for explaining a method of calculating heat transfer.

Figure 10:
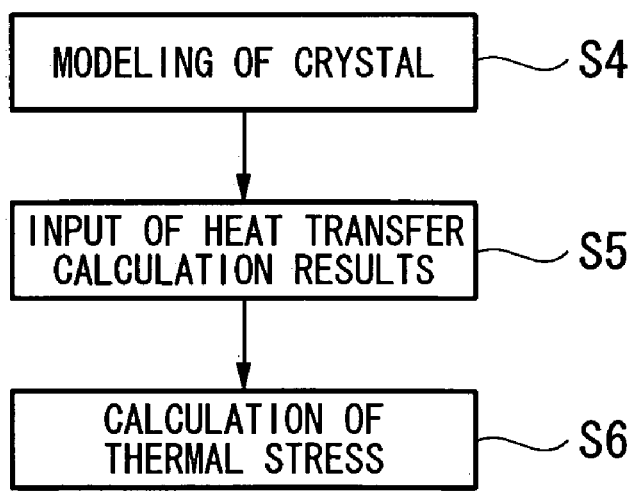

FIG. 10 is a flow chart for explaining a method of calculating thermal stress.

Figure 11:
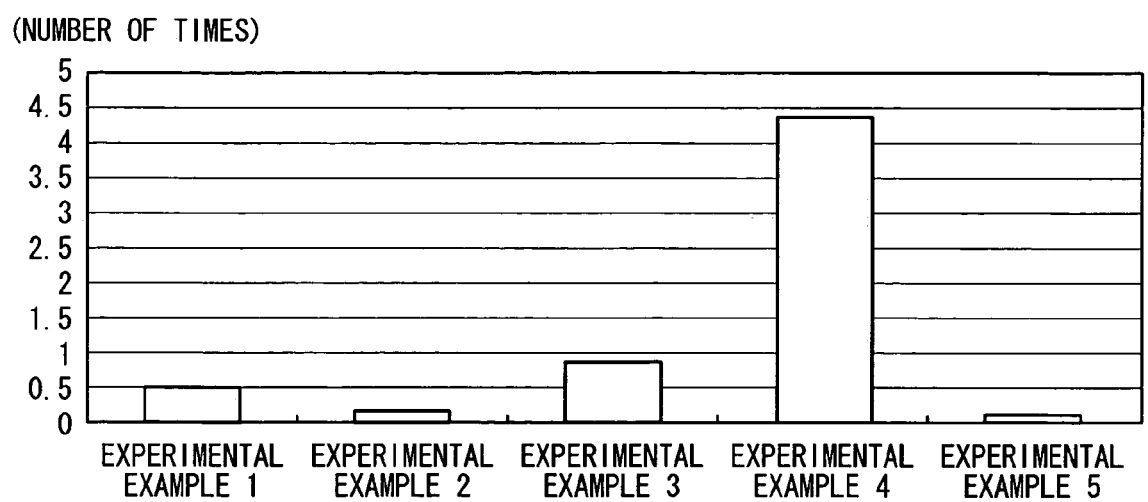

FIG. 11 is a graph showing the number of times dislocation formation occurred during crystal growth in each example.

Figure 12:
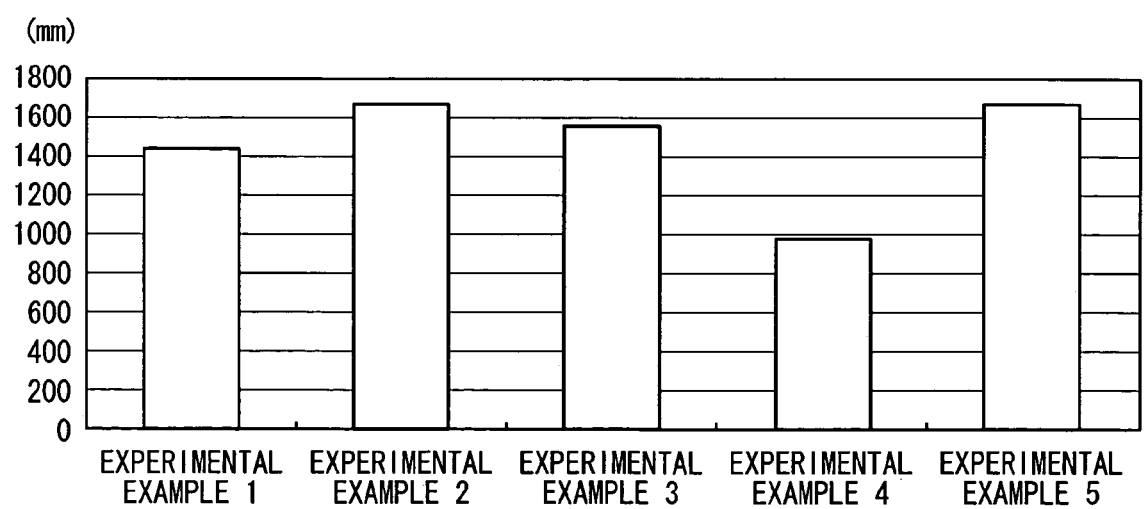

FIG. 12 is a graph showing the length of the defect-free region in each example.

PREFERRED EMBODIMENTS

A first embodiment of the present invention is described below in conjunction with the attached diagrams.

FIG. 8 is a vertical sectional view of a CZ furnace suitable for carrying out the method for producing silicon single crystals of the embodiment.

The CZ furnace shown in FIG. 8 has a crucible 1 which is centrally located within a furnace chamber, a heater 2 disposed outside of the crucible 1, and a magnetic field generator 9 disposed outside of the heater 2. The crucible 1 has a double construction composed of a quartz crucible 1a which holds inside a silicon melt 3 and an outer graphite crucible 1b which holds the quartz crucible 1a. The crucible 1 is rotated and vertically driven by a supporting shaft commonly referred to as a pedestal.

A cylindrical heat shield 7 is provided above the crucible 1. The heat shield 7 is composed of an outer graphite shell filled on the inside with a graphite felt. The heat shield 7 has an inner face which is tapered so that the inside radius gradually decreases from the top edge portion to the bottom edge portion. The outer face on the upper side of the heat shield 7 is tapered to match the inner face and the outer face on the lower side is formed as a substantially straight face, so that the thickness of the heat shield 7 gradually increases in the downward direction.

This CZ furnace has a hot zone structure by which the ratio Gc/Ge between the axial temperature gradient at the center portion of the crystal, Gc from the melting point to 1350° C. and the axial temperature gradient at the outer circumferential portion of the crystal, Ge from the melting point to 1350° C. is made to be 1.1 to 1.4, and the temperature gradient Gc is made to be from 3.0 to 3.5° C./mm. The ratio Gc/Ge is preferably from 1.2 to 1.4, and the temperature gradient Gc is preferably from 3.2 to 3.3.

The length of time during which the silicon single crystal under growth has a temperature within a range of 1000 to 800° C., i.e., the time it takes for the silicon single crystal during growth to pass through a temperature range of 1000 to 800° C., is 80 to 180 minutes, and preferably 100 to 150 minutes. Such a hot zone structure includes a cooling member of the heat shield 7 and a water cooling unit (cooling unit) 8.

The heat shield 7, which blocks heat radiation from the heater 2 and the surface of the silicon melt 3 to the lateral surface portion of the silicon single crystal 6, encircles the lateral surface portion of the silicon single crystal 6 being grown and also encircles the surface of the silicon melt 3. Exemplary specifications for the heat shield 7 are given below.

For example, the heat shield 7 may have a width W in the radial direction of 50 mm, an inner face shaped as an inverted truncated-cone with an angle θ to the vertical of 21°, and a bottom edge portion with a height H1 from the surface of the melt of 60 mm.

A water cooling unit 8 is mounted on the inside of the heat shield 7. By mounting the water cooling unit 8 on the inside of the heat shield 7, the lateral surface portion of the silicon single crystal 6 can be effectively cooled, and also, a stream of inert gas that flows rapidly down the inside of the heat shield 7 suppresses SiO precipitation on the water cooling unit 8.

The water cooling unit 8 used here is exemplified by a heat transfer coil or a water-cooled jacket having a heat transfer partition, typically made of copper or stainless steel. It is preferable to set the flow rate of water through the water cooling unit 8 to at least 10 L/min. The cooling capacity of the water cooling unit 8 can be regulated by adjusting the height of the water cooling unit 8 in the crystal pulling direction and the distance at which it is installed from the surface of the melt. The configuration of the heat transfer coil or water-cooled jacket can be suitably varied according to the rate at which cooling water will be passed through. By adjusting the cooling capacity of the water cooling unit 8, the thermal stress incurred at the lateral surface portion of a silicon single crystal being grown can be varied within a range of 30 to 45 MPa, and the length of time during which the temperature of the silicon single crystal during growth is in a range of 1000 to 800° C. can be varied within a range of 80 to 180 minutes.

Assuming the single crystal to be pulled will have a diameter Dc, the water cooling unit 8 and the cooling member are generally designed so that they have a diameter at the inner face thereof in a range of 1.20 Dc to 2.50 Dc and a length of at least 0.25 Dc, and so that the distance from the surface of the melt to the bottom edge portion of the cooling member is in a range of 0.30 Dc to 0.85 Dc.

In a horizontal magnetic field (transverse magnetic filed), the strength of the magnetic field applied by the magnetic field generator 9 is set within a range of 2000 to 4000 G, and preferably 2500 to 3500 G, and the center height of the magnetic field relative to the liquid surface of the melt is set within a range of −150 to +100 mm, and preferably −75 to +50 mm.

Alternatively, in a cusp magnetic field, the strength of the magnetic field applied by the magnetic field generator 9 is set within a range of 200 to 1000 G, and preferably 300 to 700 G, and the center height of the magnetic field relative to the liquid surface of the melt is set within a range of −100 to +100 mm, and preferably −50 to +50 mm.

By using the magnetic field generator 9 to supply a magnetic field having a strength and a center height in the above-indicated ranges, it is possible to suppress convection and thus impart to the solid-liquid interface a desirable shape.

When a silicon single crystal 6 is pulled using the CZ furnace shown in FIG. 8, the axial temperature gradient at the center portion of the crystal, Gc from the melting point to 1350° C. is from 3.0 to 3.2° C./mm and the axial temperature gradient at the outer circumferential portion of the crystal, Ge is from 2.3 to 2.5° C./mm, giving a Gc/Ge ratio of about 1.3. The thermal stress incurred at the lateral surface portion of the silicon single crystal during growth is from 30 to 45 MPa. This state remains substantially unchanged even when the pull rate is varied.

Next, a method is described wherein a silicon single crystal 6 having a body portion which is a defect-free region that contains no grown-in defects is grown using the CZ furnace shown in FIG. 8 and using a mixed gas composed of an inert gas and hydrogen gas as the gas ambient for single crystal growth.

(Setting the Operating Conditions)

First, the operating conditions are set for growing the target defect-free silicon single crystal. Initially, in order to determine the allowable ranges in the hydrogen concentration and in the pull rate at which a defect-free crystal can be obtained, the molecular hydrogen partial pressure in the gas ambient is set to mixing ratios of, for example, 0, 20, 40, 160, 240 and 400 Pa, and single crystals of the target diameter (e.g., 300 mm) are grown under the respective conditions.

That is, the crucible is charged with, for example, 300 kg of high-purity polycrystalline silicon, and a p-type (e.g., boron, aluminum, gallium) or n-type (e.g., phosphorus, arsenic, antimony) dopant is added in order to set the resistivity of the single crystal to the desired value, such as 10Ω·cm. The interior of the apparatus is reduced to a pressure of 1.33 to 26.7 kPa (10 to 200 torr) in an argon ambient and, after setting the molecular hydrogen partial pressure in the ambient gas to the predetermined mixing ratio indicated above, a stream of gas is passed through the furnace.

Next, a horizontal magnetic field of 3000 G, for example, is applied by the magnetic field generator 9 at a magnetic field center height of from −75 to +50 mm relative to the liquid surface of the melt. At the same time, the polycrystalline silicon is heated by a heater 2, turning it into a silicon melt 3, a seed crystal mounted on a seed chuck 5 is immersed in the silicon melt 3, and crystal pulling is carried out while rotating the crucible 1 and a pull axis 4. The crystal orientation may be {100}, {111} or {110}. After necking down the seed to make the crystal dislocation free, a shoulder is formed and the crystal cross-section is grown out to the target body diameter.

When the crystal body has reached a length of 300 mm, for example, the pull rate is adjusted to a rate, such as 1.0 mm/min, that is sufficiently higher than the critical rate. Next, the pull rate is lowered in a substantially linear manner in accordance with the pull length so that the pull rate falls below the critical rate, to 0.3 mm/min for example, once the body has reached a length of, for example 600 mm. The body is then grown to a length of, for example 1600 mm at this pull rate and tailing is carried out under normal conditions, after which crystal growth is brought to an end.

Single crystals that have been grown in this way under different hydrogen concentrations are vertically sectioned along the pull axis so as to fabricate plate-like test pieces containing the region near the pull axis. Copper decoration is then carried out, and the distribution of grown-in defects is examined. First, each test piece is immersed in an aqueous copper sulfate solution, then air dried and subsequently heat treated in a nitrogen ambient at 900° C. for about 20 minutes. Next, in order to remove the copper silicide layer in the surface of the test piece, the test piece is immersed in a HF/HNO$_3$ mixed solution and several tens of microns of material at the surface layer is etched away, and then the position of the OSF ring and the distribution of the respective defect regions are examined by x-ray topography. Also, the COP density in this sliced piece is examined by a suitable technique such as the OPP method, and the dislocation cluster density is examined by Secco etching.

By carrying out the crystal pulling experiment described above, the relationship between the V/G ratio and the hydrogen concentration for each of defect regions such as IR scattering defect forming region, OSF forming region, PV region, PI region, and dislocation cluster forming region, can be determined. Moreover, such experiments to change the pull rate are carried out in several portions such as from 300 mm to 600 mm, from 500 mm to 800 mm, and from 700 mm to 1000 mm. Thereby, the relationship between the pull rate margin for the defect-free crystal and the axial position in the crystal can be determined, making it possible to set the operating conditions for obtaining a defect-free crystal.

(Growing a Silicon Single Crystal)

Next, using the CZ furnace shown in FIG. 8 and using a mixed gas composed of an inert gas and hydrogen gas as the gas ambient for growing the single crystal, a silicon single crystal 6 in which the body portion is a defect-free region that is free of grown-in defects was grown under suitable operating conditions set by the method described above.

In the method for producing silicon single crystals of this embodiment, the gas ambient in which the crystal is grown is a mixed gas composed of an inert gas and hydrogen gas. Hence, even in the case in which the lateral surface portion of the silicon single crystal during growth incurs thermal stresses, the formation of thermal stress-induced dislocations can be effectively suppressed. Moreover, the pull rate margin for obtaining a defect-free crystal can be enlarged, enabling a silicon single crystal 6 in which the body portion is a defect-free region that is free of grown-in defects to be easily grown.

In the above-described embodiment, the lateral surface portion of the silicon single crystal during growth is actively cooled using a water cooling unit 8 (cooling unit). However, the present invention is not limited to the use of a water cooling unit 8 (cooling unit) for cooling the lateral surface portion of the silicon single crystal during growth. Other suitable unit may be used for cooling, provided that it is capable of cooling the lateral surface portion of the silicon single crystal during growth.

EXAMPLES

The following experiments were carried out to verify the merits of the present invention.

Defect-free silicon single crystals having a diameter of 300 mm and a body length of 1800 mm were grown using crystal growing apparatuses having Hot Zone Structures 1 to 3 shown in Table 1 and described below, and using argon gas or a mixture of argon gas and hydrogen gas as the ambient.

TABLE 1

| Hot zone structure | Thermal stress at lateral surface portion of crystal (MPa) |
|---|---|
| 1 | 40 |
| 2 | 35.7 |
| 3 | 28 |

(Hot Zone Structure 1)

The CZ furnace shown in FIG. 8 was used and the cooling capacity of the water-cooling unit 8 was set by adopting dimensions of an inside diameter of 600 mm and a height of 200 mm, and by placing the bottom edge at 150 mm above the surface of the melt. In addition, a horizontal magnetic field of 3000 G was applied by a magnetic field generator 9 so that the center height of the magnetic field was 0 mm relative to the liquid surface of the melt. This provided a hot zone structure by which the axial temperature gradient at the center portion of the crystal, Gc from the melting point to 1350° C. was made to be 3.2° C./mm, the axial temperature gradient at the outer circumferential portion of the crystal, Ge was made to be 2.5° C./mm, and the ratio Gc/Ge was made to be 1.3.

(Hot Zone Structure 2)

The CZ furnace shown in FIG. 8 was used and the cooling capacity of the water-cooling unit 8 was set by adopting dimensions of an inside diameter of 600 mm and a height of 150 mm, and by placing the bottom edge at 200 mm above the surface of the melt. In addition, a horizontal magnetic field was applied in the same way as for Hot Zone Structure 1. This provided a hot zone structure by which the axial temperature gradient at the center portion of the crystal, Gc from the melting point to 1350° C. was made to be 3.0° C./mm, the axial temperature gradient at the outer circumferential portion of the crystal, Ge was made to be 2.5° C./mm, and the ratio Gc/Ge was made to be 1.2.

(Hot Zone Structure 3)

A CZ furnace without a water cooling unit 8 and a heat shield 7 was used, and a horizontal magnetic field was applied in the same way as for Hot Zone Structure 1. This provided a hot zone structure by which the axial temperature gradient at the center portion of the crystal, Gc from the melting point to 1350° C. was made to be 2.8° C./mm, the axial temperature gradient at the outer circumferential portion of the crystal, Ge was made to be 2.5° C./mm, and the ratio Gc/Ge was made to be 1.1.

Silicon single crystals were grown using the crystal growing apparatuses having these Hot Zone Structures 1 to 3, and the thermal stresses incurred at the lateral surface portion of the silicon single crystal under growth were determined by the method shown below.

<Calculating Heat Transfer>

The thermal stress was determined using the results obtained from carrying out the heat transfer calculations shown in FIG. 9.

In the heat transfer calculations, first the crystal pulling furnace was modeled (S1). Modeling of the pulling furnace involved shape digitization in which the outside shape and the mesh shape were digitized, and setting of the physical property values of materials in which the thermal conductivity and the surface emissivity were determined by the properties of the materials.

Next, shape coefficients that express how two surface elements appear to each other were calculated (S2). Calculation of the shape coefficient was carried out for each surface element.

Then, heat transfer calculations were performed (S3). In this step, repeated calculations were performed by the SOR method to determine the radiative heat transfer, and convergence calculations were carried out based on the heat balance.

The convergence calculations based on the heat balance were performed as shown below under the convergence condition that the pull rate stabilizes within a setting range.

1. After completion of the nth heat transfer calculation, letting the heat flux passing through the silicon single crystal be Hso, the heat of solidification that arises at the solid-liquid interface be Hla and the heat flux passing through the silicon melt be Hlq, Hla was set so as to satisfy the expression of Hso=Hla+Hlq. Here, since Hla is a function of the pull rate, the pull rate which satisfies the heat balance can be determined.

2. In the case in which the pull rate was faster than the target value of convergence, the heat output of the heater was increased. In the case in which the pull rate was slower than the target value of convergence, the heat output of the heater was decreased.

3. The (n+1)th heat transfer calculation was performed.

<Thermal Stress Calculation>

Calculation of the thermal stress was carried out as shown in FIG. 10. First, modeling of the crystal (S4) was carried out. This involved shape digitization in which the outside shape and the mesh shape of the silicon single crystal were digitized, and setting of the following physical property values for the silicon single crystal: thermal expansion coefficient, Young's modulus, Poisson's ratio.

Next, the results of the heat transfer calculations were input, thereby carrying out input of the temperature distribution (S5).

After this, thermal stress calculations were carried out by a finite element method, thereby calculating the thermal stress within the crystal (S6).

Table 1 shows the results obtained for the thermal stress incurred at the lateral surface portion of the silicon single crystal during growth when silicon ingots were grown using the crystal growing apparatuses having Hot Zone Structures 1 to 3 determined in the above way.

Experimental Example 1

A crystal growing apparatus having Hot Zone Structure 1 shown in Table 1 was used. A gas mixture in which hydrogen gas was admixed to argon gas at a molecular hydrogen partial pressure of 240 Pa was used as the gas ambient in which the single crystal was grown. A silicon single crystal that was free of defects was grown under the operating conditions set by the above-described method.

Experimental Example 2

A silicon single crystal that was free of defects was grown using a crystal growing apparatus having Hot Zone Structure 3 shown in Table 1 and using argon gas as the gas ambient in which the crystal was grown.

Experimental Example 3

A silicon single crystal that was free of defects was grown using a crystal growing apparatus having Hot Zone Structure 2 shown in Table 1 and using argon gas as the gas ambient in which the crystal was grown.

Experimental Example 4

A silicon single crystal that was free of defects was grown using a crystal growing apparatus having Hot Zone Structure 1 shown in Table 1 and described below, using argon gas as the gas ambient in which the crystal was grown, and under the operating conditions set by the above-described method.

Experimental Example 5

A crystal growing apparatus having Hot Zone Structure 3 shown in Table 1 was used. A mixed gas in which hydrogen gas was admixed to argon gas at a molecular hydrogen partial pressure of 240 Pa as the gas ambient in which the single crystal was grown. A silicon single crystal that was free of defects was grown under the operating conditions set by the above-described method.

The pull rates of the silicon single crystal (mm/min) and the pull rate margins for defect-free crystal (mm/min) obtained in this way in Experimental Examples 1 to 5 are shown in Table 2.

TABLE 2

| Experimental Example | Pull rate | Margin | Freeness from dislocations | Cracking |
|---|---|---|---|---|
| 1 | 0.51 | 0.043 | A | A |
| 2 | 0.42 | 0.015 | A | A |
| 3 | 0.534 | 0.027 | B | B |
| 4 | 0.55 | 0.03 | C | C |
| 5 | 0.4 | 0.023 | A | A |

A plurality of silicon single crystals in each of Experimental Examples 1 to 5 were grown and used as specimens to determine in the manner described below the number of times formation of dislocations occurred per one pull test during crystal growth.

Crystals in which formation of dislocations occurred at a pull length of less than 1000 mm were melted down and another attempt was made to grow a dislocation-free crystal. In the case in which these operations were repeated and a crystal that was free of dislocations over its entire length was obtained, the number of times the pulled crystal had to be melted was treated as the "number of times dislocations formed". In the case in which a crystal was obtained in which dislocation formation occurred at 1000 mm or more, the number of times the pulled crystal was melted +1 was treated as "the number of times dislocations formed".

FIG. 11 shows averages for the results in Experimental Examples 1 to 5.

Also, a plurality of the silicon single crystals in each of Experimental Examples 1 to 5 were grown and used as specimens to measure the length of the dislocation-free portion after crystal growth. FIG. 12 shows averages for these results obtained in Experimental Examples 1 to 5.

In addition, the freeness from dislocations of the silicon single crystals obtained in Experimental Examples 1 to 5 was rated based on the following criteria. These results are shown in Table 2.

A (Good): The average length of the dislocation-free region was more than 1400 mm, and the average number of times dislocations occurred was less than 0.5.

B (Fair): The average length of the dislocation-free region was from 1000 to 1400 mm, and the average number of times dislocations occurred was from 0.5 to 1.

C (Poor): The average length of the dislocation-free region was less than 1000 mm, and the average number of times dislocations occurred was more than 1.

In addition, the presence or absence of cracks in the silicon single crystals of Experimental Examples 1 to 5 that arise when the crystal was removed from the furnace or when the crystal that has been removed from the furnace was transported, was rated in accordance with the following criteria. These results are shown in Table 2.

A (Good): Cracking did not arise in any of the specimens.
B (Fair): Cracking arose in some of the specimens.
C (Poor): Cracking arose in all the specimens.

From Table 2, the degree of freeness from dislocations and the degree of cracking were both rated A in examples of the present invention, that is, in Experimental Example 1 in which Hot Zone Structure 1 was used and hydrogen was included in the ambient gas, and in Experimental Example 5 in which Hot Zone Structure 3 was used and hydrogen was included in the ambient gas.

In Experimental Example 4, which was a comparative example of the present invention that differed only in that hydrogen was not included in the ambient gas, and in which Hot Zone Structure 1 was used, the degree of freeness from dislocations and the degree of cracking were both rated C.

Therefore, when the same Hot Zone Structure 1 which cools the lateral surface portion of the silicon single crystal during growth was used, the degree of freeness from dislocations can be improved by including hydrogen in the ambient gas. Moreover, compared with cases in which hydrogen was not included in the ambient gas, it was confirmed that silicon single crystals can be obtained which undergo dislocations less often and which have a longer dislocation-free portion.

Also, from Table 2, in Experimental Example 3 in which the thermal stress was 35.7 MPa and Hot Zone Structure 2 was used, even though the thermal stress was smaller than in Experimental Example 1, the degree of freeness from dislocations and the degree of cracking were both rated B.

From Table 2, although the pull rate in Experimental Example 1 was very rapid compared with Experimental Example s 2 and 5 and was slower than in Experimental Examples 3 and 4, the results obtained were comparable. Also, even though the pull rate in Experimental Example 5 was slower than in Experimental Example 2, the results were comparable.

Table 2 also shows that the pull rate margin in Experimental Example 1 was very wide compared to that in Experimental Example 2, and relatively wide even when compared with Experimental Examples 3 to 5. The pull rate margin in Experimental Example 5 was very wide compared with Experimental Example 2.

From FIG. 11, it was confirmed that, compared with Experimental Example 4, dislocations occurred very few times in Experimental Example 1.

In Experimental Example 1, the number of times dislocations occurred was lower than in Experimental Example 3 in which Hot Zone Structure 2 was used and higher than in Experimental Example 2 in which Hot Zone Structure 3 was used. However, the results were comparable.

Therefore, it was confirmed in Experimental Example 1 that silicon single crystals could be grown at about the same frequency of dislocation formation as when the lateral surface portion of the silicon single crystal was not cooled during growth.

From FIG. 12, the dislocation-free portion of the ingot in Experimental Example 1 was more than 400 mm longer than that in Experimental Example 4. Hence, it was confirmed that silicon ingots having a long dislocation-free portion could be grown by including hydrogen in the ambient gas.

Also, from FIG. 12, the dislocation-free portion was shorter in Experimental Example 1 than in Experimental Examples 2 and 3, however the difference in the length of the dislocation-free portion was less than 250 mm, which was very small compared with the difference between Experimental Example 1 and Experimental Example 4.

As described above and demonstrated in the foregoing examples, the present invention provides a method for producing silicon single crystals which can inhibit the formation of dislocations caused by thermal stresses that arise from forcibly cooling the lateral surface portion of the silicon single crystal during growth, and is thus capable of producing, in a good yield and with excellent productivity, silicon single crystals that resist cracking and have a long dislocation-free portion.

What is claimed is:

1. A method for producing silicon single crystals, the method comprising:
    growing a silicon single crystal by the Czochralski method while cooling at least part of the silicon single crystal under growth with a cooling member which circumferentially surrounds the silicon single crystal and has an inner contour that is coaxial with a pull axis,
    wherein an ambient gas in which the silicon single crystal is grown includes a hydrogen-atom-containing substance in gaseous form, and
    wherein the molecular hydrogen-equivalent concentration of the gaseous hydrogen-atom-containing substance being $\alpha$ and the oxygen gas concentration being $\beta$, the concentration of oxygen gas in the ambient gas is made to satisfy the relationship: $\alpha - 2\beta > 3$ vol %.

2. The method for producing silicon single crystals according to claim 1, wherein the gaseous hydrogen-atom-containing substance in the ambient gas has a molecular hydrogen partial pressure of 40 to 400 Pa.

3. The method for producing silicon single crystals according to claim 1, wherein the gaseous hydrogen-atom-containing substance is hydrogen gas.

4. The method for producing silicon single crystals according to claim 1, wherein a lateral surface portion of the silicon single crystal under growth is cooled in such a way that the ratio Gc/Ge between an axial temperature gradient at a center portion of the crystal, Gc from the silicon melting point to 1350° C. and an axial temperature gradient at an outer circumferential portion of the crystal, Ge from the silicon melting point to 1350° C. is from 1.1 to 1.4.

5. The method for producing silicon single crystals according to claim 1, wherein the axial temperature gradient at the center portion of the crystal, Gc is from 3.0 to 3.5° C./mm.

6. The method for producing silicon single crystals according to claim 1, which renders a body portion of the silicon single crystal into a defect-free region that is free of grown-in defects.

7. The method for producing silicon single crystals according to claim 1, wherein by setting the molecular hydrogen partial pressure of the gaseous hydrogen-atom-containing substance in the gas ambient within a range of 40 to 160 Pa, a silicon single crystal is grown from which silicon wafers whose entire surface is an oxygen precipitation-promoting region can be obtained.

8. The method for producing silicon single crystals according to claim 1, wherein by setting the molecular hydrogen partial pressure of the gaseous hydrogen-atom-containing substance in the gas ambient within a range of 160 to 400 Pa, a silicon single crystal is grown from which silicon wafers whose entire surface is an oxygen precipitation-inhibiting region can be obtained.

9. The method for producing silicon single crystals according to claim 1, wherein the pressure in the furnace is in a range of 30 to 50 torr, nitrogen is present within the gas ambient at a concentration of 20 vol % or less.

10. The method for producing silicon single crystals according to claim 1, wherein the time it takes for the silicon single crystal during growth to pass through a temperature range of 1000 to 800° C., is 80 to 180 minutes.

11. The method for producing silicon single crystals according to claim 1, wherein the cooling member includes a water cooling unit.

12. The method for producing silicon single crystals according to claim 1, wherein assuming the single crystal to be pulled has a diameter Dc, the cooling member is designed so that it has a diameter at the inner face thereof in a range of 1.20 Dc to 2.50 Dc and a length of at least 0.25 Dc, and so that the distance from the surface of the melt to the bottom edge portion of the cooling member is in a range of 0.30 Dc to 0.85 Dc.

13. The method for producing silicon single crystals according to claim 4, wherein the ratio Gc/Ge is from 1.2 to 1.4, and the temperature gradient Gc is from 3.2 to 3.3.

* * * * *